May 8, 1962 S. M. MONDA ETAL 3,033,955

ELECTROMECHANICAL FILTER

Filed Oct. 15, 1959

INVENTORS.
WILLIAM A. FORDECK.
STEVEN M. MONDA.
BY
Lockwood, Woodard, Smith & Weikart.
ATTORNEYS.

United States Patent Office 3,033,955

Patented May 8, 1962

3,033,955

ELECTROMECHANICAL FILTER

Steven M. Monda, Fort Wayne, and William A. Fordeck, Garrett, Ind., assignors to The Magnavox Company, Fort Wayne, Ind., a corporation of Indiana Filed Oct. 15, 1959, Ser. No. 846,575
8 Claims. (Cl. 200—91)

The present invention relates to an electromechanical filter and more particularly to a device for receiving any of a plurality of different frequency audio frequency signals and selectively coupling that signal to a respective one of a plurality of control circuits.

The present invention finds an important utility as a part of a remote control for a television receiver. It should be understood, however, that the present invention has other applications such as in an electrical system for operating alarm signals and other analogous uses.

A primary object of the present invention is to provide a novel and improved electromechanical filter which is economical to manufacture and is dependable in operation.

A further object is to provide an electromechanical filter which is highly responsive to a plurality of narrow frequency bands.

Still a further object of the present invention is to provide an electromechanical filter incorporating means for precisely tuning vibratile reeds forming a part of the filter.

Another object of the present invention is to provide an electromechanical filter in which novel and inexpensive means are provided for adjusting the tuning of reeds forming a part of the filter.

A further object of the present invention is to provide an electromechanical filter incorporating means for producing, for equal input currents, equal amplitudes of vibration of various differently tuned reeds forming a part of the filter.

Still another object of the present invention is to provide an electromechanical filter in which means are provided for eliminating chatter and the undesirable results of chatter which occurs during the closing of contacts forming a part of the filter.

Still further objects and advantages of the invention will become apparent as the description proceeds.

The full nature of the invention will be understood from the accompanying drawings and the following description and claims:

Figure 1:
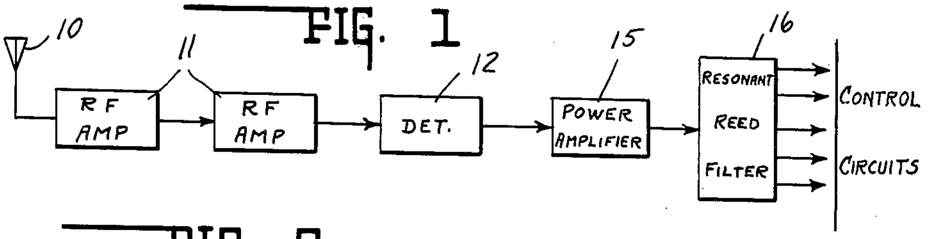
FIG. 1 is a schematic electrical representation of a portion of a radio frequency receiver within which the electromechanical filter embodying the present invention may be used.
Figure 2:
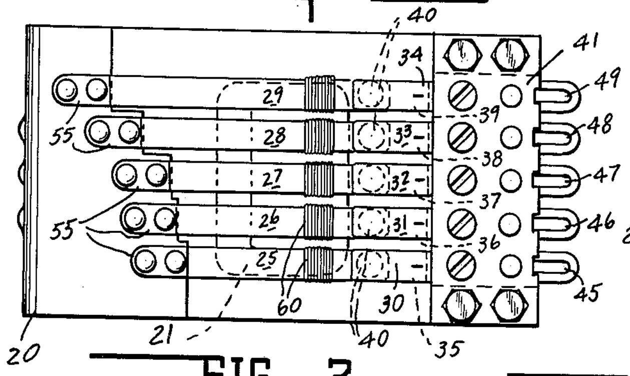
FIG. 2 is a top plan view of the electromechanical filter embodying the present invention.

Referring now to the drawings, and more particularly to FIG. 1, there is illustrated conventional components of a radio receiver which comprises an antenna 10, a pair of radio frequency amplifiers 11—11, a detector 12, a power amplifier 15, and a resonant reed filter 16 constructed according to the present invention. The illustrated radio frequency receiver may be used as a part of a remote control of a television receiver, as fully described in the above mentioned application. The radio frequency signal received by the antenna 10 is amplified in conventional manner by the radio frequency amplifiers 11, is demodulated by the detector 12, and is delivered by the amplifier 15 to the resonant reed filter 16. Depending upon the particular audio frequency of the signal delivered to the filter, the filter will selectively energize one of a plurality of control circuits such, for example, as the control circuits of a television receiver. For example, five such control circuits might be provided for operating the channel selector, brightness increase, brightness decrease, volume increase, and volume decrease.

Referring now to the remaining figures, the present invention comprises a frame or yoke 20 having an electromagnet 21 mounted thereon. The electromagnet is provided with input leads 22—22 to which the audio frequency signal from the power amplifier 15 is delivered for exciting resonant vibration in one of a plurality of reeds 25–29 which are mounted upon the frame 20. A plurality of contact arms 30–34 are also mounted upon the frame 20 by means of insulation plate 41 and have secured to their lower surfaces a plurality of contact blades 35–39.

Each of the reeds 25–29 has a different length and therefore is resonant to a different frequency. It is preferable in the construction of the device that the reeds be arranged to be resonant to frequencies within one octave so that harmonic frequencies will not produce undesired vibrations in the reeds. When an undulating current of the same frequency to which one of the reeds is tuned is applied to the electromagnet, the particular reed will be vibrated causing a contact 40 mounted thereon to intermittently contact the corresponding contact blade and to allow intermittent flow of current through the particular contact and contact blade. The frame 20 may be grounded and each of the contact arms may be connected to a respective control circuit by means of terminals 45–49 on the contact arms 30–34, respectively.

Figure 7:
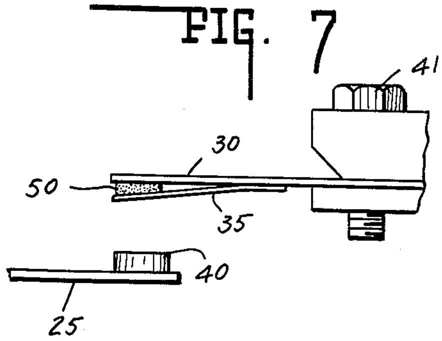
FIG. 7 is an enlarged fragmentary side elevation similar to FIG. 3 and showing electrical contacts and associated structure forming a part of the illustrated filter.

Referring now more particularly to FIG. 7, there is illustrated a vibration damper comprising a section or piece of foam or sponge material 50 received between the blade 35 and the contact arm 30. This foam material may be, for example, foam polyvinyl chloride. As the contact 40 closes with the contact blade 35, there is a tendency for chatter to result which produces undesirable electrical effects in the control circuits. By the provision of the cushioning material 50 along with the precious metal contact blade, the shock of closing of the contacts is taken up and chatter is eliminated. It should be understood that the contact blade is relatively thin and easily deformable with respect to the contact arm. Thus, the contact arm provides a stiff backing for the contact blade maintaining its position relatively uniform while the contact blade and foam material are easily deformable to prevent chatter.

Figure 8:
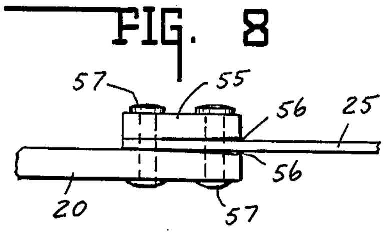
FIG. 8 is an enlarged fragmentary side view similar to FIG. 3 and showing the details of mounting of a plurality of reeds forming a part of the filter.

Referring now to FIG. 8, the details of mounting of a representative one of the reeds are shown. A mounting plate 55 is provided for each reed for securing or clamping the reed to the frame 20. In forming the mounting plate 55 and the frame 20, stamping burrs 56—56 are produced upon the edges of the plate and frame. It is the normal practice to file or otherwise remove the burrs resulting from a stamping operation. However, in the present invention, these burrs are used to precisely set the tuning of the reeds. The mounting plate 55 is fixed to the frame by means of rivets 57 with the burrs 56 aligned and projecting towards one another so as to engage the reed 25 at the point where it projects from between the mounting plate and the frame. The burrs act similarly to opposed knife edges and make possible the precise grasping of the reed on a line at the exact edges of the plate and frame and eliminate the possibility of an area wherein the plate engages the reed at one point and the frame engages the reed at a different point. For this reason, the reed will be engaged at opposite points and precisely tuned and will be resonant only to frequencies in a very narrow band.

Figures 3, 5, 6:
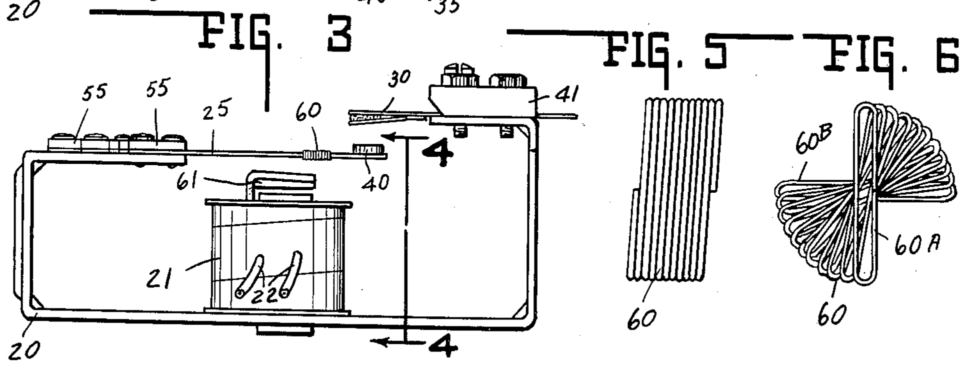
FIG. 3 is a side elevation of the device of FIG. 2.
FIG. 5 is an enlarged side view of a means for adjusting the resonant frequency of vibratile reeds forming a part of the filter illustrated in FIGS. 2–4.
FIG. 6 is an end view of the structure of FIG 5, showing it in a different position.

On each of the reeds 25–29, there is provided a coil spring 60 which has a torsional bias from one end to the other causing the spring to resiliently hold its position upon its particular reed and yet be adjustable longitudinally of the reed to vary the tuning thereof. Each of the springs 60 has a flattened shape corresponding to the flattened shape of each reed. FIG. 5 shows the spring 60 in flattened position which is also its biased position as it would appear on one of the reeds. FIG. 6 shows the spring in its original non-stressed position as it would appear prior to placing it upon a reed. As can be seen from FIG. 6, one end 60A of the spring is arranged at an angle of 90 degrees to the other end 60B of the spring. When the spring is mounted on a reed, one end tends to rotate with respect to the other end whereby the spring grips the reed firmly and holds its adjusted position without the aid of a fastening device.

Figure 4:
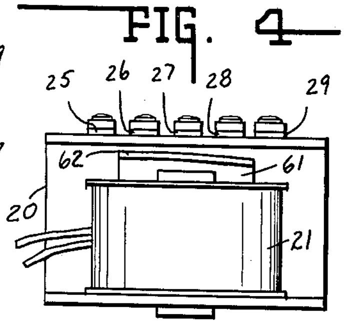
FIG. 4 is a vertical section taken along the line 4—4 of FIG. 3 in the direction of the arrows.

Referring now more particularly to FIG. 4, the shape of the pole piece 61 of the electromagnet is shown in detail. As has been mentioned above, the various reeds 25–29 have different lengths. The reed 25 is shortest and the reeds 26–29 are progressively longer. When a given current is provided to the electromagnet to excite the reeds, less electromagnetic flux is needed to vibrate the longest reed 29 at a given amplitude than is necessary to vibrate the shorter reeds. Because of this fact, the pole piece 61 has its upper flange portion 62 bent away from the longer of the reeds. Thus, when the exciting current is of a given strength, whichever reed is resonant to the current frequency will vibrate at a given amplitude.

While the invention has been disclosed and described in some detail in the drawings and foregoing description, they are to be considered as illustrative and not restrictive in character, as other modifications may readily suggest themselves to persons skilled in this art and within the broad scope of the invention, reference being had to the appended claims.

The invention claimed is:

1. An electromechanical filter comprising a plurality of flattened, differently tuned vibratile reeds, electrical contacts on the vibratile portions of said reeds and cooperating contacts arranged within the amplitude of vibration of said reeds, an electromagnet located for vibrating said reeds in response to undulating currents of the same frequencies to which said reeds are tuned, and a plurality of coil springs each received upon a respective one of said reeds, each of said springs being flattened to a shape conforming to the shape of its respective reed and having a bias therein from one end to the other whereby said spring tends to resiliently hold its position on its reed but may be moved longitudinally of its reed to change the tuning thereof.

2. An electromechanical filter comprising a frame, a plurality of differently tuned vibratile reeds, a plurality of mounting plates, means for holding said plates and frame together with said reeds clamped therebetween and extending therefrom in cantilever fashion, said frame and plates having aligned edges from which said reeds extend, said aligned edges being formed with burrs resulting from the stamping out of said plates and said frame, the burrs of said frame projecting toward the burrs of said plates, said burrs engaging said reeds to provide precisely located points of mounting for said reeds whereby said reeds are precisely tuned, electrical contacts on the vibratile portions of said reeds and cooperating contacts arranged within the amplitude of vibration of said reeds, and an electromagnet located for vibrating said reeds in response to undulating currents of the same frequencies to which said reeds are tuned.

3. An electromechanical filter comprising a plurality of vibratile reeds, each of said reeds having a different length whereby each of said reeds is resonant to a different frequency, electrical contacts secured to the vibratile portions of said reeds and cooperating contacts arranged within the amplitude of vibration of said reeds, and an electromagnet located for vibrating said reeds in response to undulating currents of the same frequencies to which said reeds are tuned, said electromagnet having a pole piece shaped in such a manner that it is closest to the shortest of said reeds, and spaced at progressively greater distances from progressively longer reeds whereby said reeds will vibrate resonantly at equal amplitudes for equal energizing currents in said electromagnet.

4. An electromechanical filter comprising a plurality of elongated, flattened, vibratile reeds, each of said reeds having a different length whereby each of said reeds is tuned to a different frequency, a frame, a plurality of mounting plates, means for holding said plates and frame together with said reeds clamped therebetween and extending therefrom in cantilever fashion, said frame and plates having aligned edges from which said reeds extend, said aligned edges being formed with burrs resulting from the stamping out of said plates and said frame, the burrs of said plates projecting toward the burrs of said frame, said burrs engaging said reeds to provide precisely located points of mounting for said reeds whereby said reeds are precisely tuned, a plurality of contact arms mounted on said frame, a precious metal contact blade secured to each of said contact arms, resilient cushioning material received between each contact arm and blade, a plurality of electrical contacts on the vibratile portions of said reeds, each of said contacts located adjacent a respective one of said contact blades in such a manner that the respective contacts and contact blades are open when said reeds are idle and are closed during a portion of a vibratory cycle when respective reeds are vibrated resonantly, an electromagnet located for vibrating said reeds in response to undulating currents of the same frequency to which respective reeds are tuned, said contact blades being located between said reeds and said contact arms whereby said cushioning material takes up the shock of a contact engaging a contact arm and prevents chatter, said electromagnet having a pole piece shaped in such a manner that it is closest to the shortest of said reeds and spaced at progressively greater distances from progressively longer reeds whereby said reeds will vibrate resonantly at equal amplitudes for equal energizing currents in said electromagnet, and a plurality of coil springs each received upon a respective one of said reeds, each of said springs being flattened to a shape conforming to the shape of its respective reed and having a bias therein from one end to the other whereby said spring tends to resiliently hold its position on its reed but may be moved longitudinally of its reed to change the tuning thereof.

5. An electromechanical filter comprising a frame, a tuned vibratile reed, a mounting plate, means for holding said plate and frame together with said reed clamped therebetween and extending therefrom in cantilever fashion, said frame and plate having aligned edge members engaging the clamped portion of said reed, said edge members projecting outwardly of the surfaces of said frame and plate into opposed engagement with said reed to provide precisely located clamping points on said reed whereby said reed is precisely tuned, and an electromagnet associated with said reed for vibrating it in response to undulating current of the same frequency to which said reed is tuned.

6. An electromechanical filter comprising a frame, a tuned vibratile reed, a mounting plate, means for holding said plate and frame together with said reed clamped therebetween and extending therefrom, said frame and plate having members engaging a limited area of said reed, said members projecting outwardly of the surfaces of said frame and plate into opposed engagement with said reed to provide precisely located clamping points on said reed whereby said reed is precisely tuned, and an electromagnet associated with said reed for vibrating it in response to undulating currents of the same frequency to which said reed is tuned.

7. An electromechanical filter comprising a tuned reed, an electrical contact on the vibratile portion of said reed and a cooperating stationary contact arranged within the amplitude of vibration of said reed, an electromagnet disposed in operative relation to said reed for vibrating it in response to undulating currents of the same frequency to which said reed is tuned, and a coil spring embracing and engaging the vibratile portion of said reed with sufficient frictional contact normally to maintain itself in a fixed position on said reed but movable longitudinally of said reed to change the tuning thereof.

8. An electromechanical filter comprising a tuned reed having an elongated vibratile portion of constant cross-section, an electrical contact on the vibratile portion of said reed and a cooperating stationary contact arranged within the amplitude of vibration of said reed, an electromagnet disposed in operative relation to said reed for vibrating it in response to undulating currents of the same frequency to which said reed is tuned, and a weight transversely embracing and engaging the vibratile portion of said reed and movable linearly and longitudinally on said reed to change the tuning thereof, said weight having a resilient bias therein causing it to frictionally grip said reed and retain position thereon.

References Cited in the file of this patent

UNITED STATES PATENTS

| | | |
|---|---|---|
| 1,190,923 | Lindquist | July 11, 1916 |
| 1,400,126 | Wotton | Dec. 13, 1921 |
| 1,919,041 | Roe | July 18, 1933 |
| 2,163,195 | Edwards | June 20, 1939 |
| 2,565,508 | Lomholt | Aug. 28, 1951 |
| 2,580,732 | Cohen | Jan. 1, 1952 |
| 2,950,368 | Londell | Aug. 23, 1960 |

FOREIGN PATENTS

| | | |
|---|---|---|
| 484,942 | Great Britain | May 12, 1938 |